(12) United States Patent  
Bao et al.

(10) Patent No.: US 8,249,541 B2
(45) Date of Patent: Aug. 21, 2012

(54) SUBHARMONICALLY PUMPED MIXER (75) Inventors: Mingquan Bao, Västra Frölunda (SE); Harald Jacobsson, Västra Frölunda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1128 days.

(21) Appl. No.: 12/094,310

(22) PCT Filed: Nov. 23, 2005

(86) PCT No.: PCT/EP2005/056165
§ 371 (c)(1),
(2), (4) Date: May 20, 2008

(87) PCT Pub. No.: WO2007/059802
PCT Pub. Date: May 31, 2007

(65) Prior Publication Data
US 2008/0287088 A1    Nov. 20, 2008

(51) Int. Cl.
*H04B 1/28* (2006.01)

(52) U.S. Cl. ........................... 455/330; 455/333

(58) Field of Classification Search ............ 455/313, 455/318, 323, 326, 330, 333, 334; 327/355, 327/357, 358
See application file for complete search history.

(56) References Cited

U.S. PATENT DOCUMENTS

| 6,574,457 B1 * | 6/2003 | Salminen ............ 455/333 |
| 6,901,249 B1 | 5/2005 | Kobayashi |
| 6,937,849 B2 * | 8/2005 | Kluge et al. ............ 455/333 |
| 7,570,936 B2 * | 8/2009 | Vice ............ 455/326 |

FOREIGN PATENT DOCUMENTS

WO    WO 2004/088835 A1    10/2004

* cited by examiner

*Primary Examiner* — Thanh Le (57) ABSTRACT

The present invention relates to a sub-harmonically pumped conversion mixer arrangement that includes a transistor arrangement and transistor terminals for application of a local oscillator, LO-, signal and application of a radio frequency, RF-, signal and for extraction of a mixed intermediate frequency, IF-, signal. The transistor arrangement includes at least one NMOS transistor and at least one PMOS transistor. The drain of the at least one NMOS transistor is interconnected with the drain of the at least one PMOS transistor, and in that the gate of the at least one PMOS transistor is interconnected with the gate of the at least one NMOS transistor.

22 Claims, 6 Drawing Sheets

*Fig. 1*

PRIOR ART

Fig. 11

SUBHARMONICALLY PUMPED MIXER

FIELD OF THE INVENTION

The present invention relates to a subharmonically pumped conversion mixer arrangement which comprises a transistor arrangement and transistor terminal ports for application of a local oscillator signal and application/extraction of a radio frequency signal and extraction/application of a mixed intermediate signal.

STATE OF THE ART

Figures 1, 2:
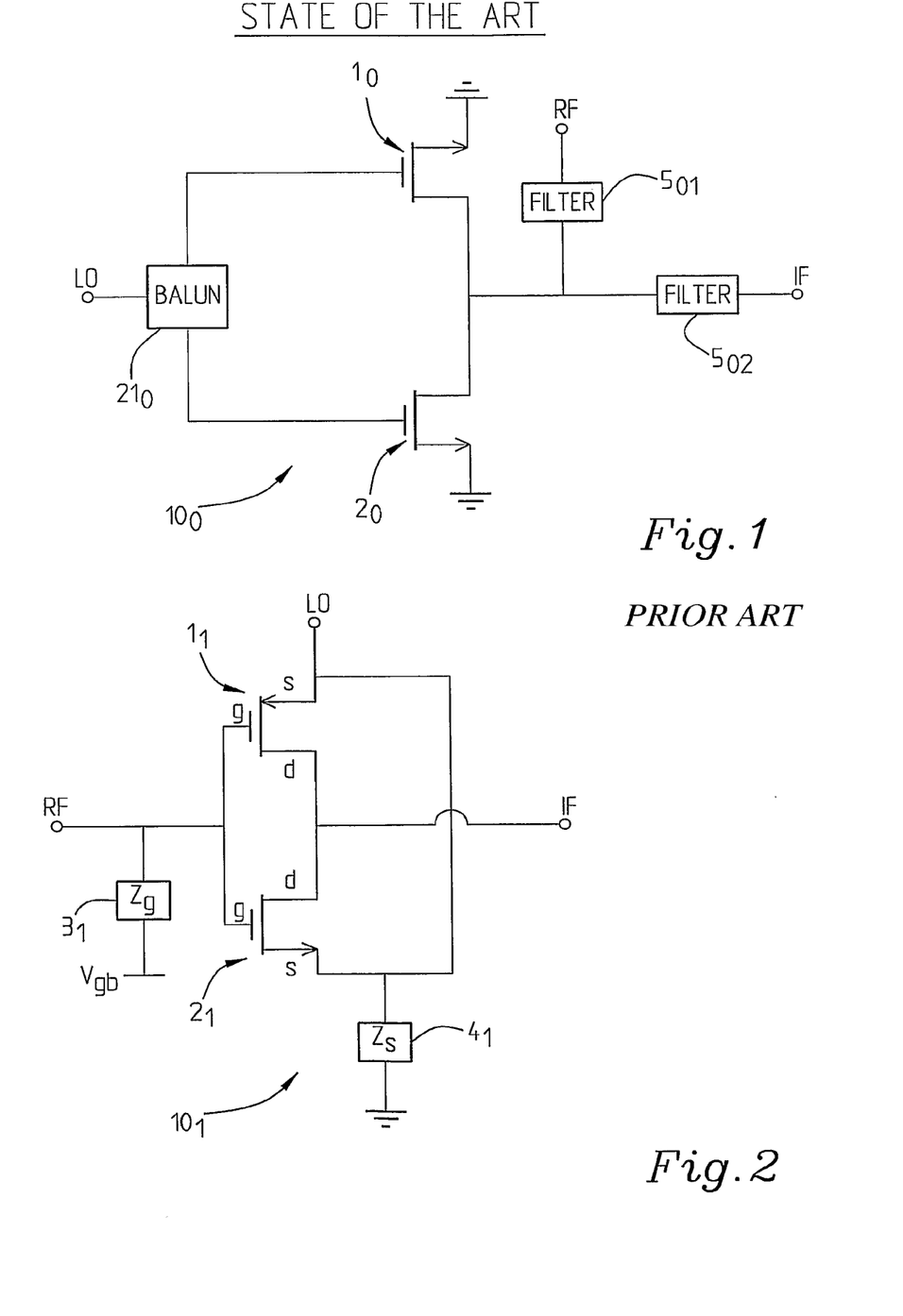
FIG. 1 shows a state of the art conversional subharmonic mixer.
FIG. 2 shows a first embodiment of a down-conversion mixer with separate ports for RF-, LO-, IF-signals.

Mixers are among others used in radio systems in order to realize frequency shifts and actually constitute a most critical building block in a radio system. Different kinds of mixers are known. One type of a mixer is the so-called subharmonically pumped mixer. A subharmonically pumped mixer is driven by a local oscillator (LO) signal, the frequency of which is only half or more generally a fraction, e.g. ⅓, ¼ of the local oscillator frequency for a fundamental mixer. It is attractive with mixers having low LO power requirements, a large frequency bandwidth range as compared to other mixers such as for example active FET mixers and diode mixers, and which are well-suited for highly linear mixing operations. Subharmonically pumped resistive mixers have the advantages of a good LO-RF and LO-IF isolation respectively due to LO frequency being different from the IF frequency and the RF frequency, which particularly facilitates filtering, and under some circumstances also due to the differential LO-signal. However, such architectures require an LO balun which may occupy a large part of the chip area, or a differential VCO. Subharmonic mixers are attractive for several reasons among others because a low phase noise LO source is easy to achieve since the LO frequency is allowed to be a fraction, e.g. half of the LO frequency of a conventional (non-subharmonical) mixer. Especially in the millimeterwave range a low phase noise LO source is not easy to achieve. In several subharmonic mixers, as referred to above, a balun or a differential signal generating circuit has to be used in order to provide two LO-signals which are 180 degrees out of phase with respect to one another. Those two LO-signals will drive two parallel connected FET devices at the gate terminals. Such a conversional subharmonic passive mixer $10_0$ is illustrated in FIG. 1 and it constitutes a state of the art subharmonic mixer. FIG. 1 shows a first FET transistor $1_0$ and a second FET transistor $2_0$ with interconnected drains. The RF-signal is applied at the interconnected drains and the IF signal is extracted from the interconnected drains and at the RF input an RF (bandpass) filter is provided and at the IF output an IF filter is provided to filter out the RF components and any other unwanted signals. The two LO-signals will drive the two parallel-connected FET devices $1_0$, $2_0$ at the gate terminals and these two active devices hence work at half-cycle of the signal alternatingly. A balun $21_0$ is connected at the gates.

"A subharmonically pumped resistive dual-HEMT-mixer" by H. Zirath, Proc. of IEEE MTT-S, pp. 875-878, 1991 shows a subharmonically pumped High Electronic Mobility Transistor (HEMT)-based resistive mixer which is based on a parallel-HEMT configuration where the LO is applied to the gates with the same amplitude but with opposite phase. It is advantageous that the LO frequency is only half of the frequency needed to pump a fundamental mixer and that the AM-LO noise is suppressed and further that the RF and LO frequencies are widely separated, which facilitates the construction of the filter. The shown mixer is based on a paralleled HEMT configuration which means that the mixing element basically consists of two HEMTs where the sources and the drains are coupled together. The local oscillator is applied to both gates with the same amplitude but 180 degrees out of phase. The RF-signal is applied to the drains and the frequency mixing occurs due to the time-variable channel conductance. The conductance waveform contains only even harmonics of the LO. The intermediate frequency is extracted from the drain through an IF-filter.

"Design and analysis of miniature W-band MMIC subharmonically pumped resistive mixer" by M. F. Lei, et al., Proc. of IEEE MTT-S, pp. 235-238, 2004 shows another subharmonically pumped resistive mixer.

However, subharmonic mixers in which two FETs operate in the triode region suffer from problems with large conversion losses, typically larger than 10 dB, which may be far too much for many kinds of applications. Furthermore, an on-chip balun or differential signal generating circuitry consumes a very large chip area, which is very disadvantageous. Hence, today known subharmonic mixers suffer among others from drawbacks of consuming too much chip area, and having high conversional losses and they may also suffer from linearity problems. "Compact 28-GHz subharmonically pumped resistive mixer MMIC using a lumped-element high-pass/band-pass balun" by P. C. Yeh et al., IEEE Microwave and Wireless Component Letters, Vol. 15, No. 2, pp. 62-64, February 2005 shows a subharmonically pumped resistive mixer wherein efforts are made to reduce the size of the indispensable balun. A lumped element balun is therefore suggested as an alternative to a Marchand balun consisting of coupled transmission lines. The lumped element balun is made of four inductors and three capacitors. However, such a balun still uses a large portion of the chip area of the mixer and it, additionally, suffers from the disadvantage of a limited frequency bandwidth.

SUMMARY OF THE INVENTION

What is needed is therefore a subharmonically pumped conversion mixer arrangement which has low conversion losses. Still further a subharmonically pumped conversion mixer arrangement is needed which has a large frequency bandwidth. Still further a mixer arrangement is needed which can be made small, consumes a small chip area only, and which is cheap and easy to fabricate. Still further a mixer arrangement is needed which has a good linearity. Particularly a mixer arrangement is needed which is applicable for all frequencies, particularly for microwave frequencies as well as for millimeter frequencies. Moreover a mixer arrangement is needed which does not require such a large chip area as hitherto known subharmonically pumped mixers do. Particularly a mixer arrangement is needed which does not require an LO balun or a differential VCO.

Therefore here a subharmonically pumped conversion mixer arrangement as initially referred to is provided wherein the transistor arrangement comprises at least one NMOS transistor and at least one PMOS transistor wherein the drain of said at least one NMOS transistor is interconnected with the drain of said PMOS transistor. Further the gates of said PMOS transistor and NMOS transistor are interconnected. In such a mixer arrangement no balun and no differential signal generating (combining) circuit is needed. Therefore the mixer can be made much smaller, and there is no excessive consumption of chip area like in the case when (large) baluns are required. In particular embodiments the mixer comprises a down-conversion mixer. Then particularly the intermediate frequency IF-signal is extracted from the interconnected drains. In alternative embodiments it comprises an up-conversion mixer, in that case the RF-signal is particularly extracted from the interconnected drains.

In advantageous implementations the mixer arrangement is passive. Then the source of the NMOS and the source of the PMOS are equally biased, or grounded.

In other embodiments it is active, and the sources are DC-biased independently or (somewhat) differently. More specifically expressed, each transistor (NMOS and PMOS) then has a DC voltage difference between source and drain, which has as a consequence that the sources will be differently biased.

For a passive embodiment the same bias is applied to the source NMOS and PMOS transistors respectively or they are both grounded. If for example there is a somewhat higher voltage at the PMOS source, a slight DC current component will flow therethrough which means a smaller conversion loss. If however there is no voltage between the NMOS and PMOS sources respectively, there is substantially no DC current flowing (or only a very low DC current).

In a particularly advantageous embodiment, for application of the LO signal, application or extraction of the RF-signal, and for extraction or application of the IF-signal, separate transistor terminals are used.

In a particular embodiment the interconnected drains form a drain transistor terminal which in one embodiment is adapted to provide for extraction of the IF-signal (for a down-conversion mixer); otherwise, for an up-conversion mixer, for extraction of the RF-signal. Most particularly an IF-filter is arranged at the common drain transistor terminal. It should be clear that this is not necessary but advantageous in so far that a sum signal and/or a difference signal, or more generally unwanted signal components, can be eliminated. I.e. the IF-filter can be adapted to filter out e.g. all but the wanted IF-signal. Preferably an impedance circuit, for example comprising an inductor with a high inductance or a large resistor with a high resistance or a $\lambda/4$ transmission line, is connected to the interconnected sources, which impedance circuit has a high AC impedance and a low DC impedance. The impedance circuit may alternatively or additionally comprise impedance matching means which e.g. improves the gain. Such an impedance circuit is particularly only needed if the sources are interconnected or if a signal is applied at the sources and form a separate source terminal in order to set the DC-level, e.g. to ground or any other appropriate level. It preferably has a high impedance for an AC-signal and a low DC impedance.

In particular implementations where separate transistor ports are used for application of LO-signals and application/extraction of RF-signals IF-signals respectively, one transistor terminal is provided at the interconnected sources forming a source terminal and the local oscillator signal may for example be applied at said source terminal hence forming an LO-signal port. Even more particularly a gate transistor terminal is provided at the interconnected gates and the RF-signal is applied at said gate terminal hence forming an RF-signal port, again for a down-conversion mixer. Alternatively the gate transistor terminal provided at the interconnected gates is used for application of the local oscillator signal. The source terminal provided at the interconnected sources may also be used for application (extraction) of the RF-signal, hence forming an RF-signal port.

In other particular embodiments the drain terminal forms a multiple signal terminal or a dual drain terminal. Then, particularly the LO-signal may be applied at the gate terminal and the RF-signal is applied at the drain terminal. More particularly, also for a down-conversion mixer, the LO-signal may be applied at the drain terminal and the IF-signal be extracted from the same drain terminal then generally requiring a filter on each terminal branch. Alternatively the RF-signal is applied at the dual drain terminal and the IF-signal is extracted from said dual drain terminal as well in which case preferably each branch is provided with a filter. The RF-signal is then, in the first case, applied at the interconnected gate terminal or, in the second case, the LO-signal here is applied at the interconnected gate terminal.

All these embodiments relate to down-conversion mixers. IF-signal ports and RF-signal ports are exchanged.

Most particularly the sources are equally biased, or for example grounded, for a passive implementation or differently biased for an active implementation. In a particular embodiment a gate biasing circuit, for example a gate impedance, is connected to the interconnected gates.

According to advantageous implementations filters are connected to the interconnected gates and/or to interconnected drains and, if applicable, to interconnected sources. It should be clear that it is not necessary to have filters but that filters can be provided for at some of the locations but not all etc. It should be clear that, throughout this application, a filter is taken to mean a filter or an impedance matching means or a combination of both.

In particular implementations, with a dual drain terminal, an LO-filter or an RF-filter may be provided at the dual drain terminal whereas an intermediate frequency, IF-, filter also is provided in order to separate between the applied LO-/RF-signal and the extracted IF-signal respectively. Unless it is explicitly stated to be otherwise, the arrangements described refer to down-conversion mixers. It should be clear as referred to above that the mixer arrangement in all cases also can be used as an up-conversion mixer but in that case the RF-and IF-ports are exchanged.

Particularly the mixer arrangement is implemented as a Monolithic Microwave Integrated Circuit, MMIC. Particularly the mixer is adapted to handle RF-and LO-signals in the microwave frequency. It may also be adapted to handle RF-and LO-signals in the millimeter wave frequency region. However, it should be clear that it can be used also for any other frequency range.

BRIEF DESCRIPTION OF THE DRAWINGS

The invention will in the following be further described, in a non-limiting manner, and with reference to the accompanying drawings, in which.

DETAILED DESCRIPTION OF THE INVENTION

FIG. 1 shows a conversional subharmonic passive mixer according to the state of the art as already discussed in the state of the art section of the specification. It comprises two FET transistors $1_0$, $2_0$ and it is driven by an LO-signal the frequency of which is half of the LO frequency for a fundamental mixer. Balun $21_0$ has to be used in order to provide two LO-signals shifted 180° in phase with respect to one another, which two LO-signals drive the two parallel-connected FET devices at the gate terminals. (Alternatively a differential VCO could have been used.) The RF-signal is applied, via a filter $5_{01}$ at the drain and the IF-signal is, over filter $5_{02}$ extracted at drain as well. The disadvantages of such an arrangement have already been discussed and will therefore not be considered again.

FIG. 2 shows a first embodiment of a subharmonically pumped conversional mixer according to the invention. This particular embodiment shows a passive mixer $10_1$ used as a down-conversion mixer. Since the CMOS technology provides a possibility to develop low-cost circuits operating at microwave and millimeterwave frequencies and, in addition thereto provides NMOS and PMOS simultaneously, it has been realized that their complementary property can be used to build subharmonic mixers with low conversion losses on a small chip area since no on-chip (or off-chip) balun is required as well as no differential signal generating circuitry.

In the subharmonically pumped conversional mixer $10_1$ shown in FIG. 2, the drains of the PMOS transistor $1_1$ and of the NMOS transistor $2_1$ are interconnected or coupled to one another and also the gates of the PMOS and NMOS respectively are interconnected. In this embodiment the LO-signal is applied at the sources which is extremely advantageous in that the conversion losses get smaller than when the LO-signal is applied at the gates. The RF-signal is applied at the gate, and for DC-biasing purposes an impedance $Z_g$ $3_1$ is provided at the connection to the gates in parallel with which the RF-signal is applied, in order to provide for a DC-biasing. The impedance $Z_g$ $3_1$ may also comprise an impedance matching functionality. Since the mixer $10_1$ acts as a passive mixer, the PMOS and the NMOS transistors $1_1$, $2_1$ are biased in the same way which means that no DC-currents will flow between or through any of them. Particularly an impedance $Z_s$ $4_1$ is provided at the source connection in order to ground or to set the DC level, i.e. instead of grounding it is possible to bias at other voltages, which is applicable to all embodiments. Particularly impedance $Z_s$ $4_1$ has a high impedance for AC and a low impedance for DC and it may for example comprise an inductor with a high inductance or a resistor with a high resistance. The IF-signal is extracted from the interconnected drains. In this embodiment there are different ports, one for each signal, i.e. all three signals LO, RF, IF use separate transistor terminals which is very advantageous in that the isolation between ports is improved and each port can be matched independently. This is not necessary for the functioning of the inventive concept but it relates to an extremely advantageous implementation.

The impedance $Z_s$ $4_1$ at the source is used to isolate the AC-signal from the ground at the same time as it provides a DC ground for the sources. The drains may also be DC grounded through the IF port, but it is not necessary. When the LO-signal is applied at the interconnected sources, even though particularly both drain and source are DC grounded, the NMOS transistor $2_1$ may partly operate in the saturation region when the instantaneous drain-to-source voltage is positive during the lower half-cycle of the LO-signal swing. Meanwhile the PMOS transistor $1_1$ may operate in the saturation region during the higher half-cycle of the LO-signal swing. This is extremely advantageous for reduction of the conversion losses. Due to the complementary property of the NMOS and PMOS transistors, each of them will work for half of an LO-cycle in an alternating manner even if they are derived by the same LO-signal. The IF frequency component $|\omega_L-\omega_R|$ will be cancelled at the drain, $\omega_L$ and $\omega_R$ being the angular frequencies of the LO-and RF-signal respectively. The other IF frequency component $|2\omega_L-\omega_R|$ will be added constructively and this is the wanted IF-signal which is extracted. In this general embodiment shown in FIG. 2 there is no filter but in other, advantageous implementations the wanted IF-signal is e.g. extracted over a filter, cf. for example FIG. 4.

Due to the interconnection of the drains of the PMOS and NMOS transistors respectively, the fundamental IF frequency $|\omega_L-\omega_R|$ is cancelled.

Figure 3:
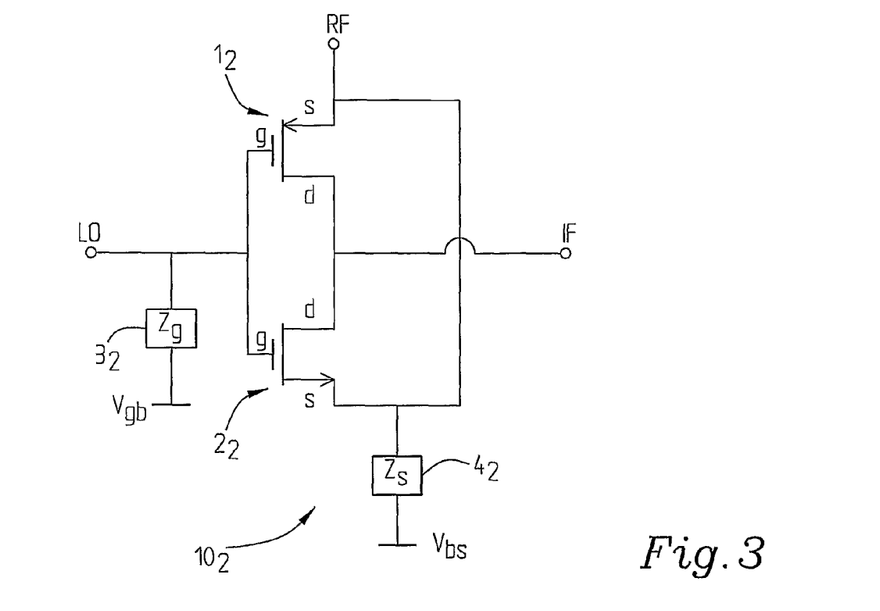
FIG. 3 shows a second embodiment of a down-conversion mixer with separate ports for LO-, RF-, IF-signals.

FIG. 3 shows another subharmonically pumped conversional mixer $10_2$ with a PMOS transistor $1_2$ and a NMOS transistor $2_2$. The IF-signal is also in this embodiment extracted at the interconnected drains. Further, also in this embodiment an impedance $Z_s$ $4_2$ is provided at the interconnected sources in order to isolate the AC signal from ground to provide a DC ground for the sources or to set the DC level at some relevant level. For exemplifying reasons it is here shown a voltage biasing $V_{bs}$, although it may of course also be ground as e.g. in FIG. 2 above. However, in this case the LO-signal is applied, here, in parallel with impedance $Z_g$ $3_2$ to the gates which also are interconnected and equally biased meaning that also this mixer is passive. When the LO-signal is applied at the gates, the transistors $1_2$, $2_2$ will operate in the triode region which gives rise to higher conversion losses for a subharmonic mixer than if the LO-signal is applied at the sources as in FIG. 2. Still, however, there is no need for a balun or any differential signal generating circuits consuming a large chip area. In addition thereto, such an arrangement requires lower LO power than an arrangement where the LO-signal is applied at the sources. Therefore also a conversional subharmonically pumped mixer $10_2$ as described in FIG. 3 still shows considerable advantages over prior art subharmonic mixers.

Figure 4:
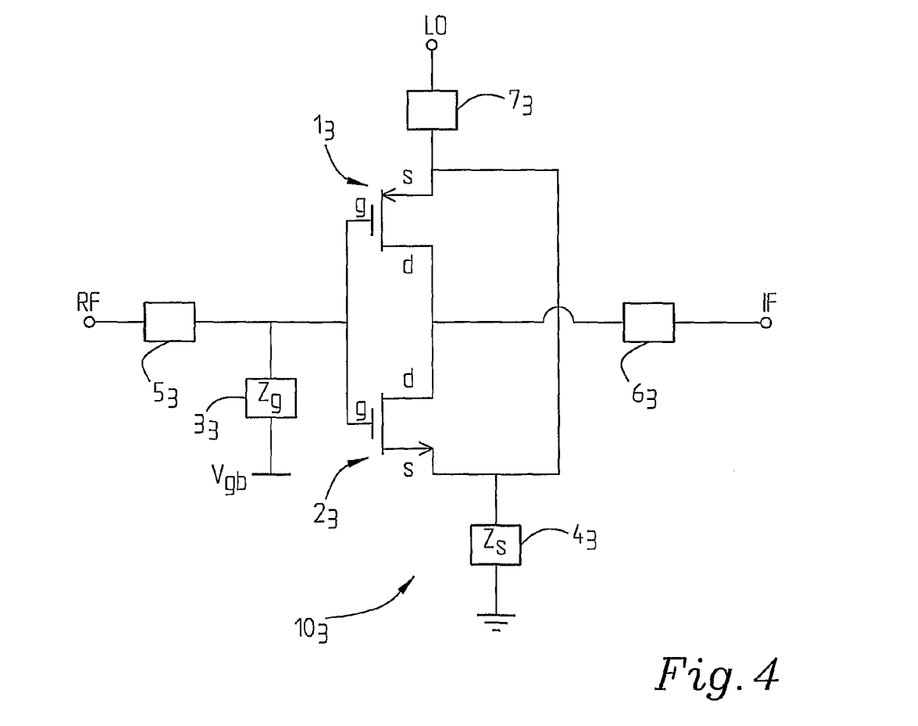
FIG. 4 shows an alternative embodiment of a down-conversion mixer.

FIG. 4 shows still another embodiment of a passive subharmonically pumped conversional mixer $10_3$ which is very similar to that of FIG. 2. Also here the LO-signal is input at the interconnected sources, the IF-signal is extracted at the interconnected drains and the RF-signal is input in parallel with impedance $Z_g$ $3_3$ to the interconnected gates. Also here an impedance $Z_s$ $4_3$ is provided at the sources to isolate the AC-signal from ground and to set the DC-level for the sources. However, in this case filters (with or without an impedance matching functionality as discussed above) are provided, most particularly a filter $6_3$ at the interconnected drain terminal for extraction of, here, the IF-signal. Although the filter $6_3$ is not actually necessary, it is advantageous in order to for example separate unwanted mixer products from the desired signal. In this case also the LO-signal is applied over a filter $7_3$ and the RF-signal is applied over a filter $5_3$ connected to the gate terminal.

It should be clear that one or more of these filters and/or impedance matching means can be excluded.

Figure 5:
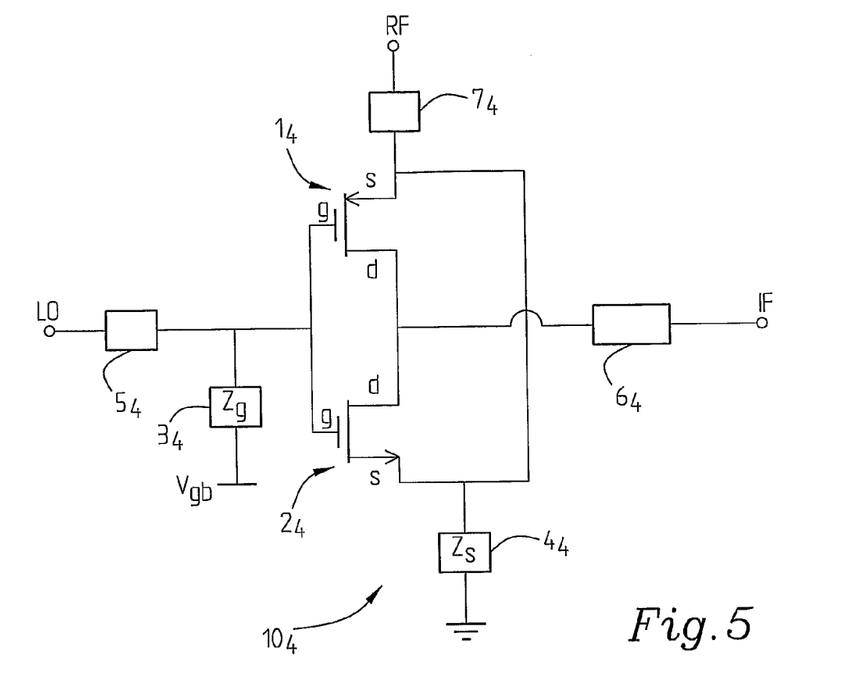
FIG. 5 shows still another embodiment of a down-conversion subharmonic mixer.

FIG. 5 shows still another embodiment of a subharmonically pumped conversional mixer $10_4$ which here substantially corresponds to the mixer $10_2$ of FIG. 3 but with the difference that filters $6_4$, $7_4$ and $5_4$ are provided at the interconnected drain terminal, at the interconnected source terminal for RF input and at the interconnected gate terminal for LO input respectively. This mixer is also used for down-conversion. The transistors $1_4$, $2_4$ and the impedances $Z_s$ $4_4$ and $Z_g$ $3_4$ generally correspond to those of FIG. 3 and also in other respects this embodiment is similar to that of FIG. 3. It should be clear that also here not all filters are necessary but preferably at least a filter at the interconnected drains for extraction of the IF-signal is included. Impedances and filters may, as referred to earlier comprise impedance matching means, or not.

Figure 6:
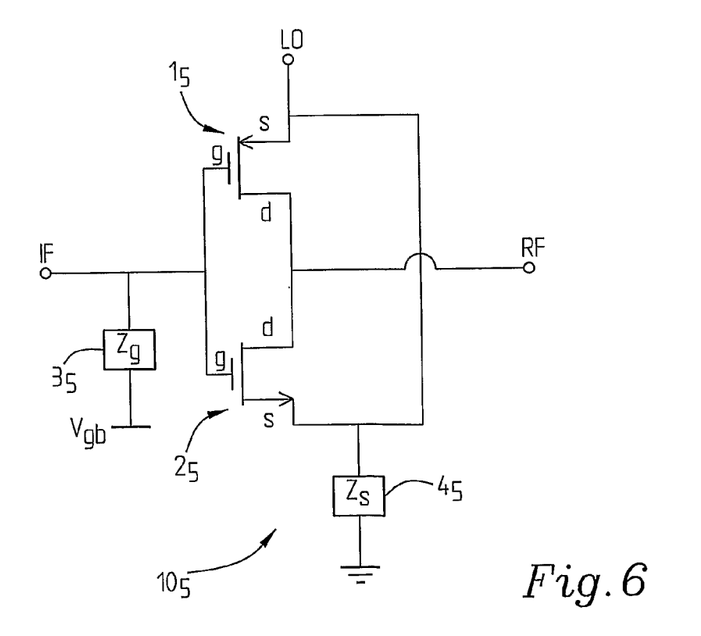
FIG. 6 shows a first embodiment of an up-conversion subharmonic mixer.

FIG. 6 shows a first embodiment of a subharmonically pumped conversion mixer $10_5$ adapted to be used for up-conversion. It actually corresponds to the mixer of FIG. 2 with a PMOS transistor $1_5$ and an NMOS transistor $2_5$ with interconnected or short circuited drains, interconnected gates and also interconnected sources. Also here impedance $Z_s$ $4_5$ is provided at the interconnected sources as in FIG. 2, as well as an impedance $Z_g$ $3_5$ at the interconnected gates, although this is not compulsory. The difference is that here the RF-signal is extracted from the drains whereas the IF-signal is applied at the gates. The LO-signal is applied at the interconnected sources. There are separate transistor terminals acting as LO-, RF-, and IF-ports respectively.

Figure 7:
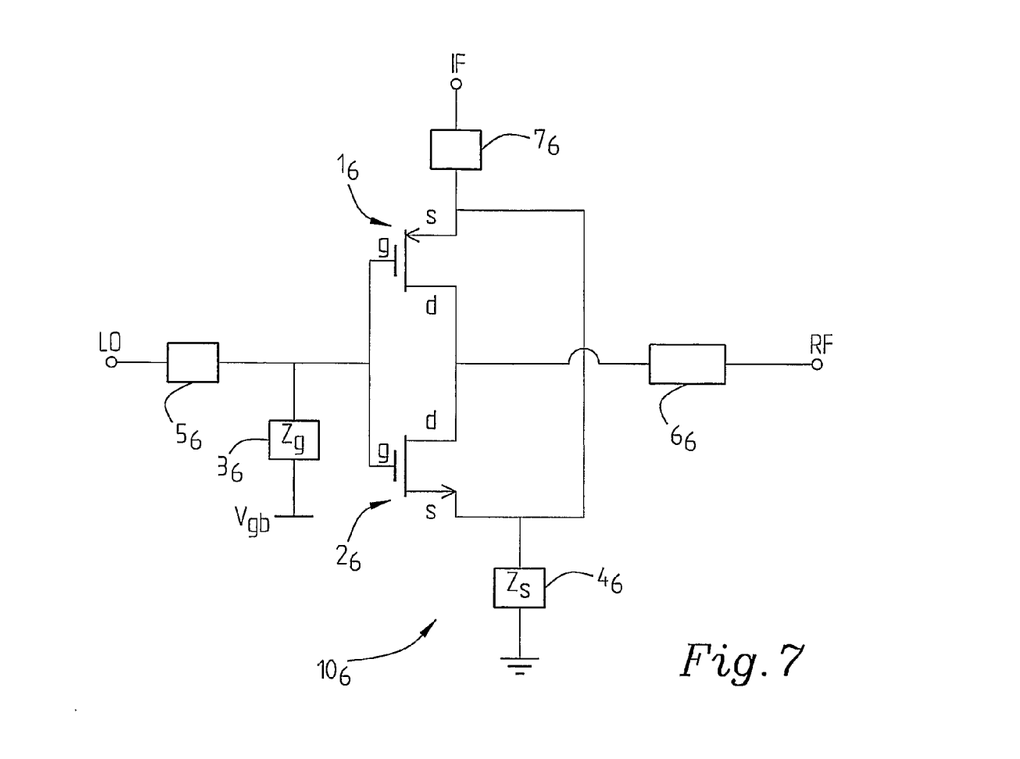
FIG. 7 shows a second embodiment of an up-conversion subharmonic mixer.

FIG. 7 shows still another embodiment of an up-conversion mixer $10_6$ which substantially corresponds to that of FIG. 5 and hence comprises a PMOS transistor $1_6$, and an NMOS transistor $2_6$, source impedance $Z_s$ $4_6$ and gate impedance $Z_g$ $3_6$. The LO-signal is input at the interconnected gates over a filter $5_6$ and preferably the impedance $3_6$, the transistor terminal ports used for IF extraction and RF application respectively have been switched such that the RF-signal is extracted from the interconnected drain terminal, here over a filter $6_6$ whereas the IF-signal is applied at the interconnected source terminal, here over a filter $7_6$. As discussed above with reference for example to FIG. 5, not all the filters are indispensable but various different implementations are possible and one or more of them may comprise impedance matching means as well.

Figure 8:
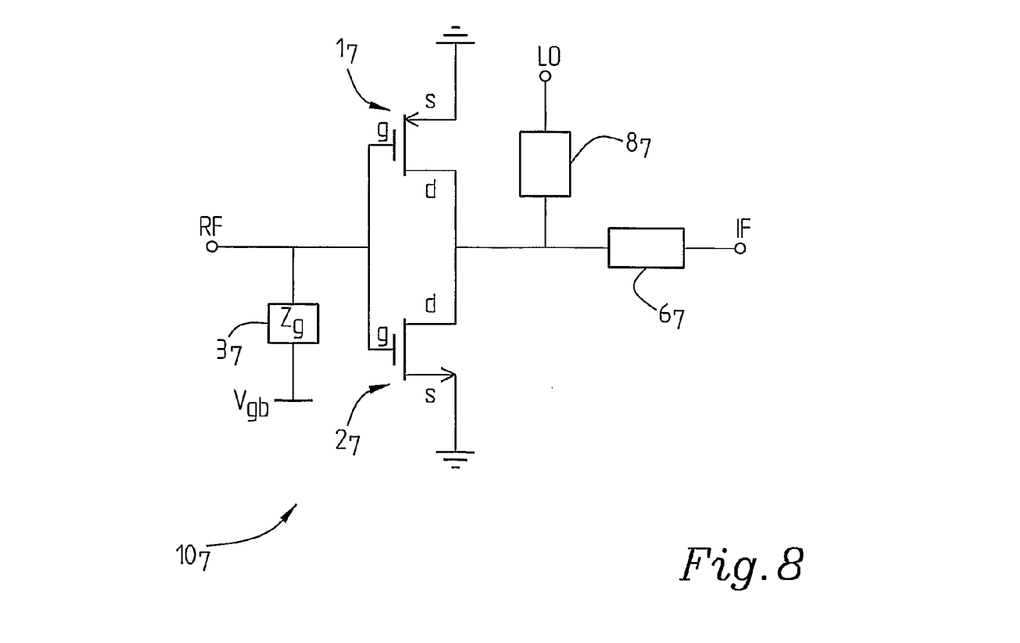
FIG. 8 shows an embodiment of a down-conversion mixer with a dual terminal at interconnected drains.

In FIG. 8 an alternative implementation of a subharmonically pumped conversional mixer used for down-conversion $10_7$ is illustrated. In this embodiment, however, comprising a CMOS transistor $1_7$ and an NMOS transistor $2_7$, the LO-signal is input at the interconnected drain terminal, particularly over a filter $8_7$ and the IF-signal is extracted at drain over a filter $6_7$. The RF-signal is applied, in parallel with impedance $Z_g$ $3_7$, which is optional and/or possibly a filter, and/or impedance matching means at the interconnected gates. Hence, here there are not separate transistor terminals that can be used for each signal which means that the isolation between the ports is somewhat inferior to that as described with reference to the previous embodiments and the ports cannot be matched entirely independently. On the other hand, it is in this case easier to set the bias level of the interconnected sources; it is sufficient to connect to ground and no signal is needed there. It should be clear that a filter also could be provided at the RF input. The filters $8_7$, $6_7$ are not indispensable, but are preferred in embodiments with a terminal acting as a dual port in order to separate the components of, here, the RF-signal and of the IF-signal respectively from one another, or more generally the desired signal from unwanted signal components.

Figure 9:
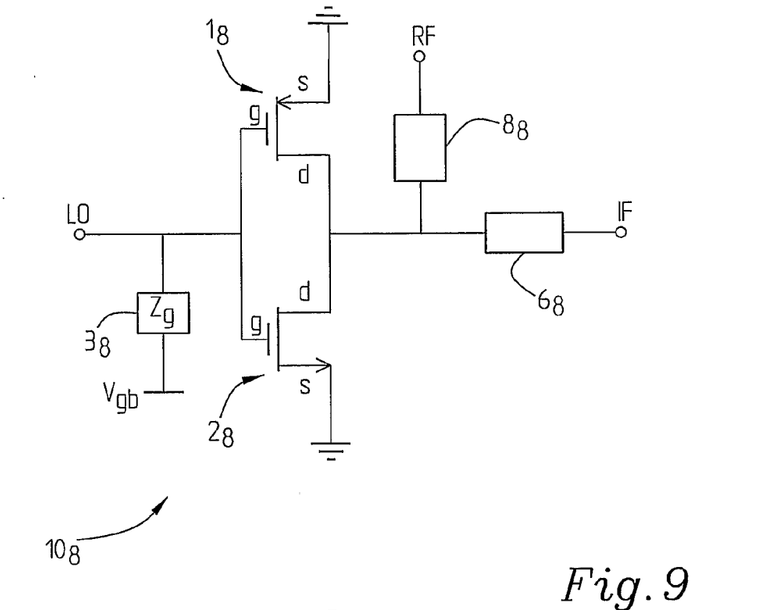
FIG. 9 shows an alternative embodiment of a down-conversion mixer with a dual port at drain.

FIG. 9 shows still another implementation of a down-conversion subharmonically pumped passive mixer $10_8$ comprising a PMOS transistor $1_8$ and an NMOS transistor $2_8$ with interconnected drains and interconnected gates. In this embodiment the LO-signal is applied in parallel with impedance $3_8$ to the gates, the sources are simply grounded as in FIG. 8 above and the RF-signal is applied at the interconnected drains over a filter $8_8$ whereas the IF-signal is extracted from the interconnected drains, preferably with the use of a filter $6_8$ to separate or filter out the RF-signal components, or more generally unwanted components.

Figure 10:
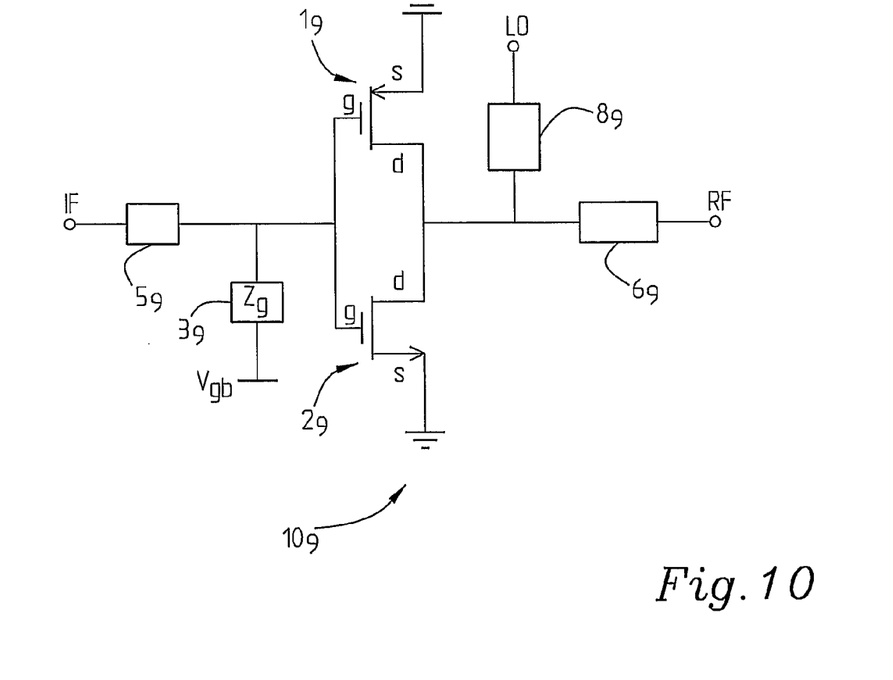
FIG. 10 shows a third embodiment of an up-conversion subharmonic mixer with a dual port at drain.

FIG. 10 shows a passive subharmonically pumped mixer $10_9$ used for up-conversion which comprises a PMOS transistor $1_9$ and an NMOS transistor $2_9$, the sources of which e.g. are grounded. In this embodiment the LO-signal is input over a filter $8_9$ at the interconnected drains and the RF-signal is extracted, over a filter $6_9$, also at the interconnected drains. This means that the common transistor terminal is used for both the signals, acting as a dual port. It should be clear that one or more of these filters are optional. The IF-signal is applied at the interconnected gates, here over a filter $5_9$ (optional) and in parallel with an impedance $3_9$. This figure is included merely for the purposes of illustrating that also for up-conversion, mixers wherein one terminal is used for two different signals, can be used. Of course other variations are also possible. In this case filters $8_9$, $6_9$ are of importance if the LO-, and the RF-signals are to be separated appropriately.

Figure 11:
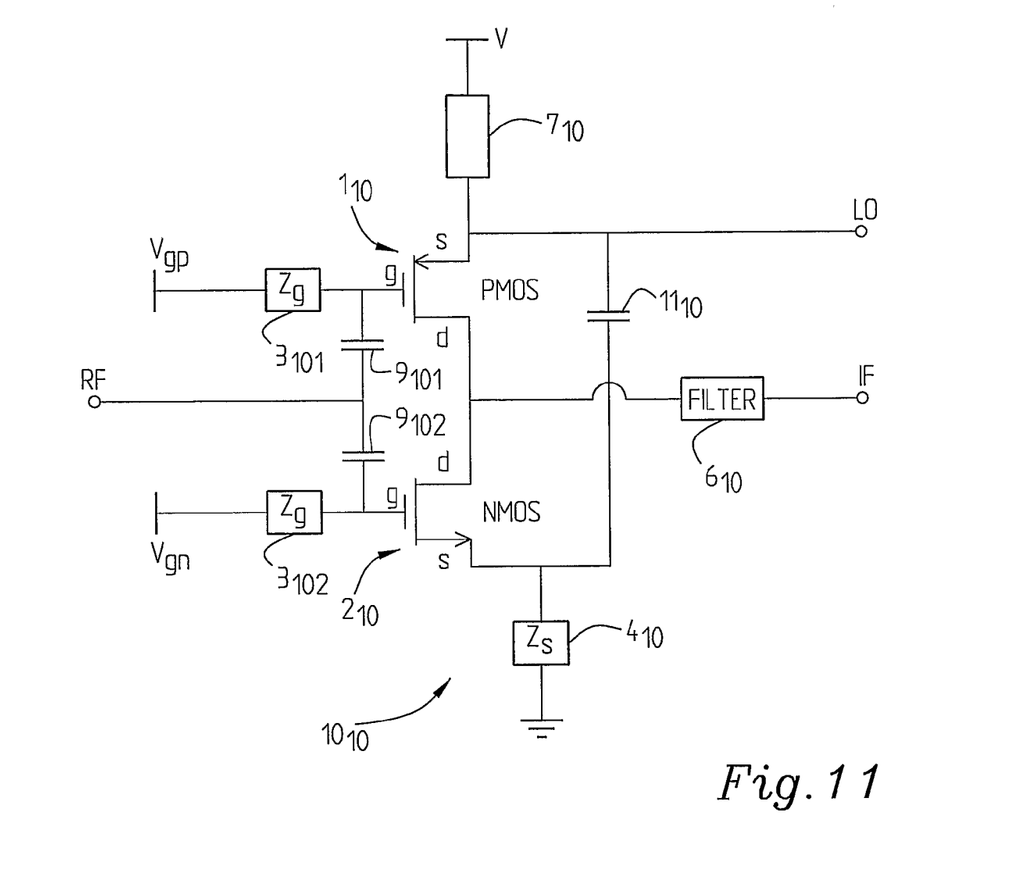
FIG. 11 shows a first embodiment of an active implementation of a subharmonic mixer according to the invention.

Finally, in FIG. 11 an implementation of an active subharmonically pumped conversional mixer is shown. The voltage biasing of the PMOS and the NMOS respectively can be said to be slightly different. If for example the voltage is somewhat higher at the PMOS source, a low current with flow therethrough which gives a lower conversion loss.

The shown mixer arrangement $10_{10}$ comprises a PMOS transistor $1_{10}$ and an NMOS transistor $2_{10}$. The drains of the transistors $1_{10}$, $2_{10}$ are interconnected as well as the sources. Here a capacitor $11_{10}$ is provided between the differently biased sources. The LO-signal is applied to the interconnected, differently biased sources and the IF-signal is extracted over filter $6_{10}$ (optional and with or without an impedance matching functionality). There are in this embodiment one transistor terminal for each signal, although embodiments with dual signal ports also are possible. The RF-signal is applied at the interconnected gates.

The biasing $V_{gp}$ and $V_{gn}$ can be different or the same. If $V_{gp}=V_{gn}$, the capacitors $9_{101}$, $9_{102}$ between the gates are not needed. The drain biasing of the PMOS and the NMOS transistor could also be different. In that case at least one capacitor is needed between the two drain nodes as well as a bias impedance for each is needed. All the impedances (here $Z_g$ $3_{101}$, $Z_g$ $3_{102}$, $Z_s$ $4_{10}$) are components blocking RF-signals but letting DC-signals through. This means that they have a high RF impedance and a finite DC impedance, e.g. comprising a large inductor or resistor. An advantage with an active implementation is that it can get a better gain—or lower losses. On the other hand it tends to be somewhat more complicated than a passive implementation, and consumes power.

It should be clear that the active implementations also can be provided for up-conversion.

For passive implementations, the interconnected drains, gates and sources means that they are AC-and DC-interconnected. In active implementations the gates are normally only AC-interconnected, although they might also in some cases be DC-interconnected as well. In passive implementations, interconnected gates relates to AC-as well as DC-interconnection. In the active implementations the sources are generally only AC-interconnected. For active as well as passive implementations, by interconnected drains is meant that they are AC-preferably also DC-interconnected although it is not necessary. However, also some less preferable implementations may be possible.

The invention is of course not limited to the specifically illustrated embodiments but can be varied in a number of ways within the scope of the appended claims.

We claim:

1. A sub-harmonically pumped conversion mixer arrangement comprising:
   a transistor arrangement and transistor terminals for application of a local oscillator (LO) signal and receiving and extracting a radio frequency (RF) signal and for receiving and extracting a mixed intermediate frequency (IF) signal, the transistor arrangement further comprising:
   at least one NMOS transistor and at least one PMOS transistor, the drain of said at least one NMOS transistor being interconnected with the drain of said at least one PMOS transistor and the gate of said at least one PMOS transistor being interconnected with the gate of said at least one NMOS transistor, wherein the source of the PMOS transistor is interconnected with the source of the NMOS transistor;
   and wherein the transistor arrangement comprises three separate transistor terminals, a gate terminal, a source terminal and a drain terminal, the terminals being adapted to provide a separate port for each of the LO, RF and IF signals respectively.

2. The mixer arrangement according to claim 1, being passive wherein the sources of the NMOS and PMOS transistors are one selected from (i) being not biased or (ii) biasing means are provided for equally biasing the sources of the NMOS and the PMOS transistors, or (iii) there is no DC-voltage difference between source and drain of the respective PMOS and NMOS transistors.

3. The mixer arrangement according to claim 1, being active wherein biasing means are provided for one of (i) biasing the source of the PMOS transistor independently or differently from the source of the NMOS transistor, or (ii) biasing only the source of the PMOS transistor or the source of the NMOS transistor respectively, or (iii) the sources are biased such that there is a DC-voltage difference between the drain and source of the respective PMOS and NMOS transistors.

4. The mixer arrangement according to claim 3, wherein biasing means are provided for biasing the gates of the PMOS and NMOS transistors independently and/or differently.

5. The mixer arrangement according claim 1 used as a down-conversion mixer for extraction of the IF signal at the transistor terminal formed at the interconnected drains used as an IF port.

6. The mixer arrangement according to claim 5, wherein the source terminal of the transistor arrangement is used as an LO signal port for application of the LO signal and in that the gate terminal is adapted to be used as an RF signal port.

7. The mixer arrangement according to claim 5, wherein the source terminal of the transistor arrangement is used as an RF signal port and the gate terminal is used as an LO signal port.

8. The mixer arrangement according to claim 1, wherein the interconnected gates form a gate terminal used as a single signal port.

9. The mixer arrangement according to claim 1 wherein the gate terminal is used as an RF signal port for application of an RF signal.

10. The mixer arrangement according to claim 1, wherein signal filters and/or impedance matching means are coupled to one or more of the transistor terminals.

11. The mixer arrangement according claim 1 further comprising impedance means provided at the interconnected sources, said impedance means setting a DC level, ground or other appropriate level and to provide for AC-signal separation therefrom, having a high AC impedance and a low DC impedance, said impedance means optionally comprising impedance matching means.

12. The mixer arrangement according to claim 1 further comprising an IF filter provided at the terminal acting as an IF port operable to filter out unwanted mixer products from the desired signal.

13. The mixer arrangement according to claim 12, wherein the IF filter comprises a low pass filter.

14. The mixer arrangement according claim 13, wherein the filter means and/or impedance matching means are provided at one or more of the terminals.

15. The mixer arrangement according claim 1, configured as an up-conversion mixer.

16. The mixer arrangement according to claim 15, wherein a transistor terminal is formed at the interconnected drains and in that said drain terminal extracts the RF signal.

17. The mixer arrangement according to claim 15, further comprising impedance means coupled to the sources to set a DC-level and in that it comprises a high AC impedance and a low DC-impedance and optionally an impedance matching functionality.

18. The mixer arrangement according to claim 1, wherein the gate terminal acts as an IF port for receiving the IF signal and in that the source terminal acts as an LO port for receiving the LO signal.

19. The mixer arrangement according to claim 1, wherein the gate terminal acts as an LO port for receiving the LO signal and the source terminal acts as an IF port for receiving the IF signal.

20. The mixer arrangement according to claim 1, implemented as a Monolithic Microwave Integrated circuit (MMIC).

21. The mixer arrangement according to claim 1, for handling RF and LO signals in the microwave frequency region.

22. The mixer arrangement according to claim 1, for handling RF and LO-signals in the millimeter wave frequency region.

* * * * *

UNITED STATES PATENT AND TRADEMARK OFFICE
CERTIFICATE OF CORRECTION

PATENT NO. : 8,249,541 B2  Page 1 of 1
APPLICATION NO. : 12/094310
DATED : August 21, 2012
INVENTOR(S) : Bao et al.

It is certified that error appears in the above-identified patent and that said Letters Patent is hereby corrected as shown below:

In Column 9, Line 44, in Claim 5, delete "according" and insert -- according to --, therefor.

In Column 10, Line 11, in Claim 11, delete "according" and insert -- according to --, therefor.

In Column 10, Line 24, in Claim 14, delete "according" and insert -- according to --, therefor.

In Column 10, Line 27, in Claim 15, delete "according" and insert -- according to --, therefor.

Signed and Sealed this
Eighteenth Day of December, 2012

David J. Kappos
*Director of the United States Patent and Trademark Office*